(12) United States Patent
Gehring et al.

(10) Patent No.: US 7,432,749 B1
(45) Date of Patent: Oct. 7, 2008

(54) CIRCUIT AND METHOD FOR IMPROVING FREQUENCY RANGE IN A PHASE LOCKED LOOP

(75) Inventors: Mark Gehring, Portland, OR (US); Nathan Moyal, West Linn, OR (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/875,667

(22) Filed: Jun. 23, 2004

(51) Int. Cl.
*H03L 7/06* (2006.01)
(52) U.S. Cl. .......................... 327/156; 327/147; 331/44
(58) Field of Classification Search ......... 327/156–158, 327/147–149; 331/33, 44, 1 A, 11
See application file for complete search history.

(56) References Cited

U.S. PATENT DOCUMENTS

| | | | |
|---|---|---|---|
| 5,491,458 A | 2/1996 | McCune, Jr. | |
| 5,651,035 A | 7/1997 | Tozun | |
| 5,831,482 A * | 11/1998 | Salvi et al. | ................. 331/1 R |
| 5,886,582 A | 3/1999 | Stansell | |
| 5,905,389 A | 5/1999 | Alleven | |
| 5,912,569 A | 6/1999 | Alleven | |
| 5,929,664 A | 7/1999 | Alleven | |
| 5,952,888 A | 9/1999 | Scott | |
| 6,040,792 A | 3/2000 | Watson et al. | |
| 6,073,193 A | 6/2000 | Yap | |
| 6,097,244 A * | 8/2000 | Chen | ........................ 327/553 |
| 6,124,750 A | 9/2000 | Alleven et al. | |
| 6,172,571 B1 | 1/2001 | Moyal et al. | |
| 6,175,282 B1 * | 1/2001 | Yasuda | ......................... 331/44 |
| 6,211,741 B1 | 4/2001 | Dalmia | |
| 6,272,646 B1 | 8/2001 | Rangasayee et al. | |
| 6,307,413 B1 | 10/2001 | Dalmia et al. | |
| 6,310,521 B1 | 10/2001 | Dalmia | |
| 6,369,660 B1 | 4/2002 | Wei et al. | |
| 6,377,646 B1 | 4/2002 | Sha | |
| 6,389,494 B1 | 5/2002 | Walton et al. | |
| 6,424,229 B1 * | 7/2002 | Justice et al. | ................... 331/4 |
| 6,445,211 B1 | 9/2002 | Saripella | |
| 6,466,078 B1 | 10/2002 | Stiff | |
| 6,496,075 B2 * | 12/2002 | Justice et al. | .................. 331/11 |
| 6,496,556 B1 * | 12/2002 | Huehne et al. | ................... 377/2 |
| 6,541,879 B1 | 4/2003 | Wright | |
| 6,553,057 B1 | 4/2003 | Sha et al. | |
| 6,560,306 B1 | 5/2003 | Duffy et al. | |
| 6,625,761 B1 | 9/2003 | Sartore et al. | |
| 6,667,642 B1 | 12/2003 | Moyal | |
| 6,671,831 B1 | 12/2003 | Sartore et al. | |
| 6,683,930 B1 | 1/2004 | Dalmia | |

(Continued)

*Primary Examiner*—Dinh T. Le

(57) ABSTRACT

A circuit and method for providing a periodic clock signal, such as a high frequency clock signal. In one example, the circuit may include a phase locked loop circuit having a voltage controlled oscillator, the voltage controlled oscillator having a voltage input, a calibration input, and a clock signal output; and a logic circuit for dynamically calibrating an operating frequency of the phase locked loop during operation of the phase locked loop. In one embodiment, the logic circuit may compare an input voltage into the voltage controlled oscillator against a reference voltage, and if the input voltage is lower than the reference voltage, the logic circuit decreases the operating frequency of the phase locked loop circuit. The logic circuit may compare an input voltage into the voltage controlled oscillator against a reference voltage, and if the input voltage is higher than the reference voltage, the logic circuit increases the operating frequency of the phase locked loop circuit.

15 Claims, 3 Drawing Sheets

U.S. PATENT DOCUMENTS

| | | |
|---|---|---|
| 6,690,224 B1 | 2/2004 | Moore |
| 6,691,201 B1 | 2/2004 | Williams et al. |
| 6,704,381 B1 | 3/2004 | Moyal et al. |
| 6,747,519 B2 * | 6/2004 | Jaehne et al. ................. 331/16 |
| 6,754,725 B1 | 6/2004 | Wright et al. |
| 6,782,068 B1 | 8/2004 | Wilson et al. |
| 6,813,672 B1 | 11/2004 | Kamran et al. |
| 6,820,160 B1 | 11/2004 | Allman |
| 6,839,778 B1 | 1/2005 | Sartore et al. |
| 6,850,554 B1 | 2/2005 | Sha et al. |
| 6,859,073 B1 * | 2/2005 | Dai et al. .................... 327/105 |

* cited by examiner

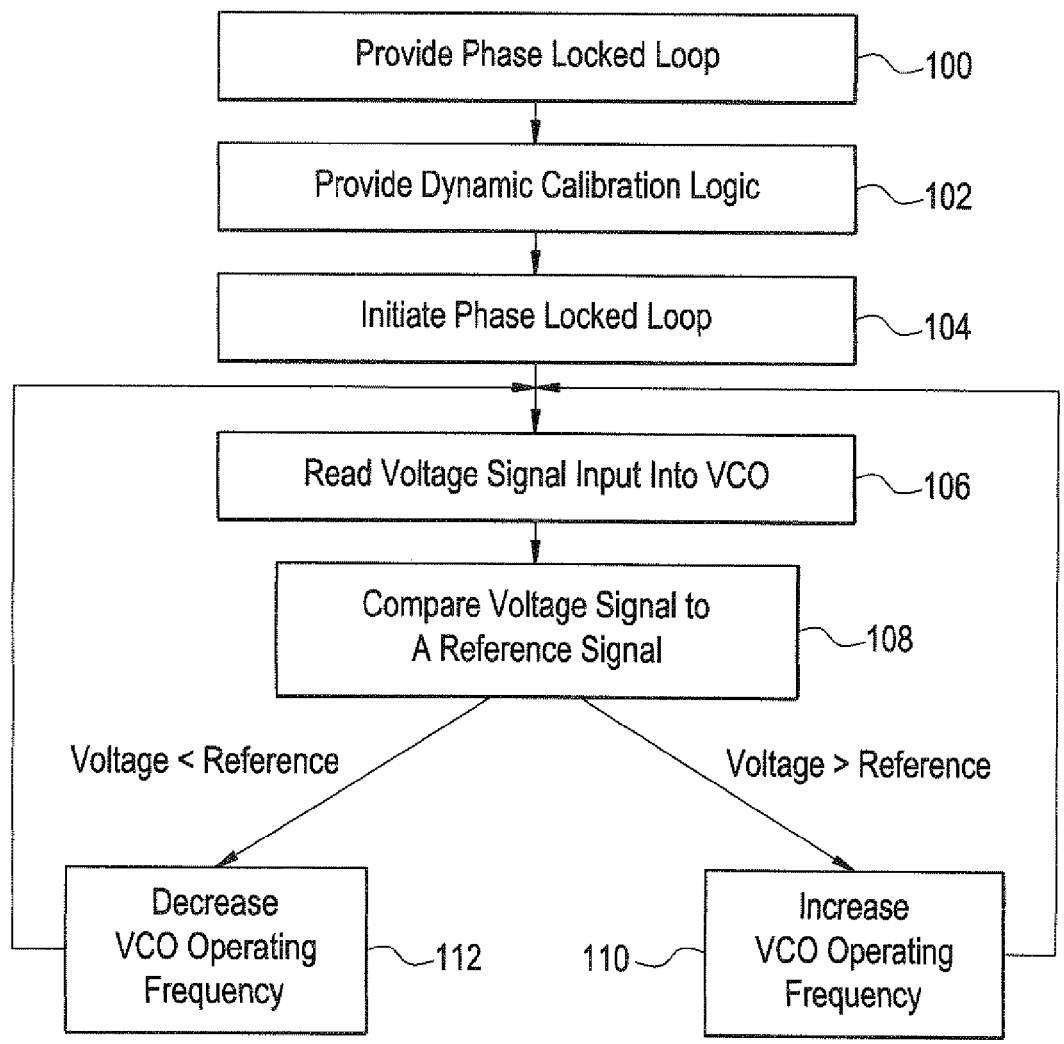

CIRCUIT AND METHOD FOR IMPROVING FREQUENCY RANGE IN A PHASE LOCKED LOOP

FIELD OF THE INVENTION

This invention, in general, relates to phase locked loop circuits.

BACKGROUND OF THE INVENTION

Phase locked loops are commonly used on various circuit applications, and may be used as clock multipliers. For instance, an input clock of 10 MHz can be multiplied by a phase locked loop to yield a signal at 1 GHz, preferably in phase alignment with the 10 MHz clock signal.

A typical phase locked loop circuit 10 is shown in FIG. 1, wherein a 20 MHz clock 12 is divided by a value M (i.e., M=2 to provide a 10 MHz reference signal in this example) and is fed into the components 14 of a typical phase locked loop. These components include a phase/frequency detector 16, a filter 18 (typically, made of a charge pump and a filter), a voltage controlled oscillator (VCO) or variable frequency oscillator (VFO) 20, and a divider 22 (shown to divide by N). The phase/frequency detector 16 sends the filter information about the frequency and phase of the reference signal 24 relative to the feedback clock signal 26. The filter 18 integrates this information into a voltage. The VCO 20 converts the voltage information into a higher speed/frequency output signal, which is fed back into the phase/frequency detector 16 through the divider 22. The divider takes the higher speed frequency 28 and divides it down for comparison to the reference signal 24 by the phase/frequency detector 16.

Low noise phase locked loops use LC-types of voltage controlled oscillators (VCO) in order to achieve high performance or high speed operations. Unfortunately, LC-types of voltage controlled oscillators have, in general, a limited frequency range of operation. Hence, LC-types of voltage controlled oscillators may be difficult to use with products or circuits needing wider frequency ranges, or fabrication processes which result in variations that necessitate wider frequency ranges.

In order to provide voltage controlled oscillators with wide frequency ranges, conventionally voltage controlled oscillators with a large amount of gain (MHz/V) can be used. However, for such conventional voltage controlled oscillators, the high gain stages subject the voltage controlled oscillator to a greater sensitivity to noise. In other systems, multiple voltage controlled oscillators can be used in an attempt to provide a wide frequency range of operation, however such designs require large areas in the semiconductors. Other voltage controlled oscillators can be calibrated prior to turning on a phase lock loop associated therewith in order to provide a wide frequency range of operation, however this operation may take time and power and may not be sufficiently robust if temperature or other process parameters change during operations.

As recognized by the present inventors, what is needed is a phase locked loop circuit can operate over a wide range of input frequencies.

It is against this background that various embodiments of the present invention were developed.

SUMMARY

In light of the above and according to one broad aspect of one embodiment of the present invention, disclosed herein is a circuit for providing a periodic clock signal, such as a high frequency clock signal. In one example, the circuit may include a phase locked loop circuit having a voltage controlled oscillator, the voltage controlled oscillator having a voltage input, a calibration input, and a clock signal output; and a logic circuit for dynamically calibrating an operating frequency of the phase locked loop during operation of the phase locked loop. In one embodiment, the logic circuit may compare an input voltage into the voltage controlled oscillator against a reference voltage, and if the input voltage is lower than the reference voltage, the logic circuit decreases the operating frequency of the phase locked loop circuit. The logic circuit may compare an input voltage into the voltage controlled oscillator against a reference voltage, and if the input voltage is higher than the reference voltage, the logic circuit increases the operating frequency of the phase locked loop circuit.

In one example, logic circuit includes an input coupled with the voltage input of the voltage controlled oscillator. The logic circuit may have an output coupled with the calibration input of the voltage controlled oscillator for adjusting the operating frequency of the voltage controlled oscillator.

In another example, the logic circuit may also include a voltage reference signal and a comparator having a first and a second input and a comparator output, the first input coupled with the voltage reference signal and the second input coupled with the voltage input of the voltage controlled oscillator. An up/down counter may be provided having at least one input and an output, the at least one input coupled with the comparator output, so that if the second input voltage from the input to the voltage controlled oscillator is lower than the reference voltage, the counter output counts downwardly to decrease the operating frequency of the phase locked loop circuit, or if the input voltage is higher than the reference voltage, the counter output counts upwardly to increase the operating frequency of the phase locked loop circuit. The circuit may also include a means for disabling the logic circuit.

According to another broad aspect of another embodiment of the present invention, disclosed herein is a method for generating a periodic clock signal such as a high frequency clock signal. In one example, the method may include providing a phase locked loop circuit having a voltage controlled oscillator; and providing for dynamically calibrating an operating frequency of the phase locked loop during operation of the phase locked loop. The operation of providing for dynamically calibrating may include providing for comparing an input voltage into the voltage controlled oscillator against a reference voltage; and providing for if the input voltage is lower than the reference voltage, decreasing the operating frequency of the phase locked loop circuit. Or the method may include as part of the operation of providing for dynamically calibrating, providing for comparing an input voltage into the voltage controlled oscillator against a reference voltage; and providing for if the input voltage is higher than the reference voltage, increasing the operating frequency of the phase locked loop circuit.

In one example, the operation of providing for dynamically calibrating may include providing a voltage reference signal, and comparing the voltage reference signal and voltage input of the voltage controlled oscillator to determine whether to adjust the operating frequency of the phase locked loop. The method may also include providing for disabling the calibration operation.

According to another broad aspect of another embodiment of the present invention, disclose herein is a method for controlling a phase locked loop. In one example, the method may include providing for dynamically calibrating an operating frequency of the phase locked loop during operation of the phase locked loop. This operation of providing for dynamically calibrating may include providing for comparing an input voltage into the voltage controlled oscillator against a reference voltage; and providing for if the input voltage is lower than the reference voltage, decreasing the operating frequency of the phase locked loop circuit. In one example, the operation of providing for dynamically calibrating may include providing for comparing an input voltage into the voltage controlled oscillator against a reference voltage; and providing for if the input voltage is higher than the reference voltage, increasing the operating frequency of the phase locked loop circuit.

The features, utilities and advantages of the various embodiments of the invention will be apparent from the following more particular description of embodiments of the invention as illustrated in the accompanying drawings.

BRIEF DESCRIPTION OF THE DRAWINGS

FIG. 3 illustrates an example of logical operations for improving the frequency range in a phase locked loop, in accordance with one embodiment of the present invention.

DETAILED DESCRIPTION

Figure 1:
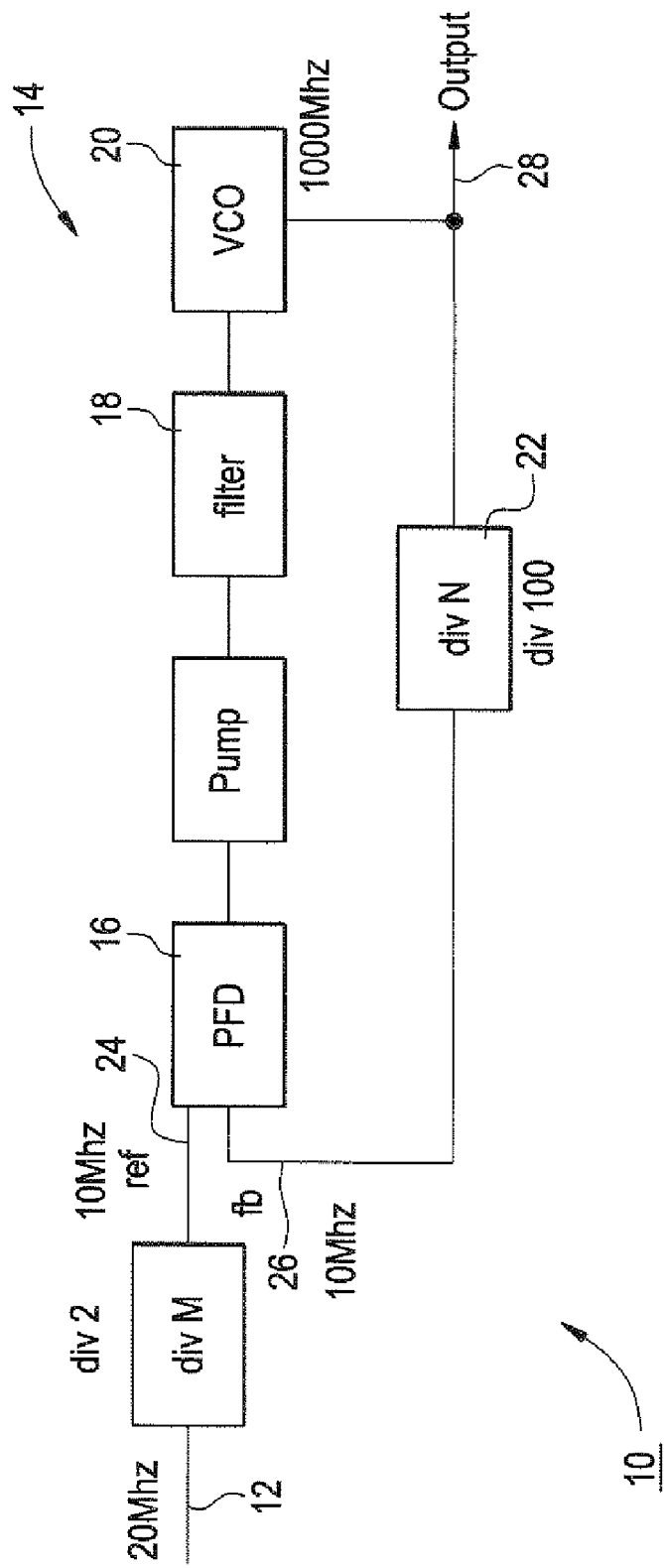
FIG. 1 illustrates a block diagram of a conventional phase locked loop.
Figure 2:
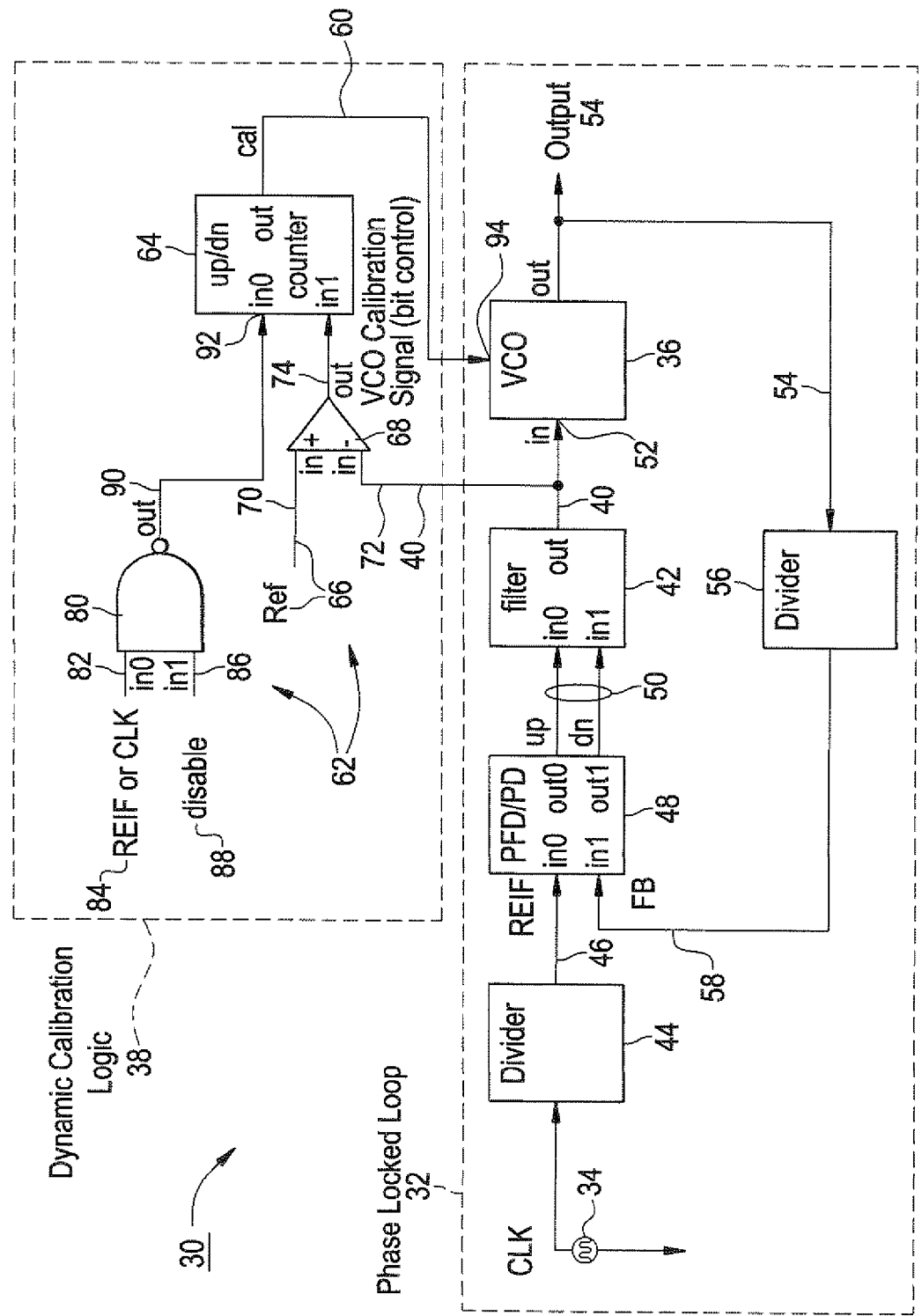
FIG. 2 illustrates a block diagram of an example of a phase locked loop in accordance with an embodiment of the present invention.

FIG. 2 illustrates an example 30 of one embodiment of the present invention. A phase locked loop 32, receiving an input clock signal 34, is provided with a voltage controlled oscillator (VCO) 36 having a programmable operating frequency, wherein the programmable operating frequency of the voltage controlled oscillator 36 is controlled by dynamic calibration logic 38. In one example, the dynamic calibration logic 38 monitors, in real time and during normal operations, the analog input 40 to the VCO 36 from the filter 42 and determines whether the operating frequency of the VCO 36 should be dynamically increased or decreased. In this manner, the phase locked loop 32 provided in FIG. 1 can operate over wide frequency ranges and the phase locked loop 32 will dynamically adjust to compensate for variations in parameters or operating conditions. Various embodiments of the present invention will now be described.

In the example of FIG. 2, a clock signal 34 is input into a frequency divider 44 which provides a reference frequency signal 46 which is coupled with a phase/frequency detector 48, also known as a phase comparator. The output 50 of the phase/frequency detector 48 drives a filter 42, and the output 40 of the filter 42 is coupled with the input 52 to a voltage controlled oscillator 36. The VCO 36 provides an output 54 which is received by a frequency divider 56 that provides a divided signal 58 to the frequency/phase detector 48. As shown in FIG. 2, a feedback loop is formed between the output 54 of the VCO 36, the frequency divider 56, and the input to the frequency/phase detector 48.

The dynamic calibration logic 38 monitors the input 40 or 52 to the VCO 36 and determines whether the operating frequency of the VCO 36 should be dynamically, and preferably synchronously, increased or decreased in real time. The dynamic calibration logic 38 outputs a signal 60 to the VCO 36 to adjust its operating frequency.

The phase locked loop 32 may include one or more frequency dividers 44, 56 as shown in FIG. 2. In one example, the first frequency divider 44 divides the input clock signal 34, and the second frequency divider 56 divides the output signal 54 from the VCO 36 and provides a feedback path back to the phase/frequency detector 48. Both frequency dividers 44, 56 may be formed using conventional dividers.

The phase/frequency detector 48 receives the reference clock signal 46 from the divider 44 and also receives the feedback clock signal 58 that comes from the VCO output 54 having been divided down by the divider 56. In one example, the phase/frequency detector 48 compares the input signals 46, 58 and generates an output signal 50 whose pulse width is proportional to the change or difference between the time difference or differences between the driving edges of the two input signals 46, 58. In one example, the phase/frequency detector 48 generates an output 50 having a pulse width that increases as the time difference between the input signals increases. In another example, the output 50 of the phase/frequency detector 48 is proportional to the phase difference of the input signals received by the phase/frequency detector.

In another example as shown in FIG. 2, the phase/frequency detector 48 has a pair of outputs 50, the UP signal and the DOWN signal. In this example, the UP signal output is asserted when the reference clock signal 46 is ahead of the feedback signal 58, and in this case, the pulse width of the UP signal is proportional to the time or phase difference between the reference clock signal 46 and the feedback signal 58. The DOWN signal output is asserted when the reference clock signal 46 lags behind the feedback signal 58, and in this case, the pulse width of the DOWN signal is proportional to the time or phase difference between the reference clock signal 46 and the feedback signal 58. In one example, the up/down signals are converted to an up/down current which charges or discharges the PLL filter 42. The filter 42 converts the up/down signals to a voltage 40 which drives the VCO 36.

The output signals from the phase/frequency detector 48 provide pulse width information to the filter 42 wherein the pulse width is proportional to the phase difference between the signals input to the phase/frequency detector. In one example, the filter 42 is a low pass filter that is conventionally used in a phase lock loop. In another example, the phase/frequency detector 48 and filter 42 can be implemented as a filter module.

The filter 42 takes the pulse width information and converts it into a voltage 40. For instance, if there is a wide pulse width of the UP signal, the filter 42 will convert or integrate this information to a higher output voltage of the filter. Conversely, if the DOWN signal input to the filter 42 has a very wide pulse width, the filter 42 will produce a lower voltage on its output. Hence, the output 40 of the filter 42 is a voltage signal that will move up or down in magnitude depending upon the phase information coming out of the phase/frequency detector 48.

The VCO 36 receives the voltage 40 from the filter 42, and the VCO 36 generates its clock with the frequency of the clock proportional to the input voltage 40 from the filter 42. In one example, if the input voltage 40 increases, the clock frequency on the output 54 of the VCO 36 will also increase; conversely, if the input voltage 40 decreases, the frequency of the VCO output clock signal 54 also decreases. In one example, the bit control 60 can control a resistive load, or internal currents, or capacitance, for example. In one embodiment, one bit can correspond to 10 MHz of frequency charge.

In one example, the dynamic calibration logic 38 includes binary decision logic 62 to direct a counter 64 to count either up or to count down, depending upon the output of the binary decision logic 62. For example, the analog voltage input 40 to the VCO 36 and a reference voltage 66 are compared to indicate which direction the VCO 36 should be dynamically calibrated. This forms a digital calibration that can be used to continuously track the analog controlled voltage input 40 the VCO 36.

A comparator 68 may be provided with a first input 70 coupled with a reference voltage signal 66 and a second input 72 sampling or receiving the input voltage signal 40 or 52 to the VCO 36. The output 74 of the comparator 68 is coupled with an input 76 of the counter. In one example, the comparator output 74 is high if the reference signal 66 is greater than the input voltage signal 40, and conversely, the comparator output 74 is low if the reference 66 is lower than the input voltage signal 40.

In one example, the reference signal 66 that is coupled with the input 70 to the comparator 68 can come from any voltage source or current source, depending upon the particular implementation. In one example, the reference signal 66 is a constant voltage reference which is selected based upon the operating frequency at which the VCO 36 is desired to be operated at. The reference signal 66 may be generated by an internal voltage source.

A NAND gate 80 may be provided with a first input 82 receiving a clock signal or a reference signal 84, and a second input 86 receiving a disable signal 88. The output 90 of the NAND gate 80 is coupled with an input 92 of the counter 64. The disable signal 88, in one example, is active low, such that if the disable signal 88 is held low while the clock/reference input 84 into the NAND gate 80 oscillates, the output 90 of the NAND gate 80 remains high irrespective of the clock/reference signal 84, thereby effectively disabling the counter 64. Otherwise, when the disable signal 88 is high, the output 90 of the NAND gate 80 is a digital signal which toggles between low and high with a frequency proportional to the reference/clock input 84 to the NAND gate 80. Other logic can be used in place of or in addition to the NAND gate 80.

In one example, the counter 64 has a pair of inputs 92, 76 and an output 60. The output 60 is coupled to the calibration input 94 of the VCO 36 for controlling the operating frequency of the VCO. If the output 74 of the comparator 68 is high (meaning that the voltage 40 coming out of the filter 42 is lower than the reference voltage 66 into the comparator 68), then as a clock signal 84/90 is received into the counter 64, the counter 64 will start counting down. Conversely, if the output 74 of the comparator 68 is low, then as a clock signal 84/90 is received by the counter 64, the counter 64 will start counting up.

In one example, if the voltage input 40 to the VCO 36 is lower than the reference voltage 66, then the output 74 of the comparator 68 goes high, and when the rising edge of the clock 84/90 is received by the counter 64, the counter 64 will count down, and that decremented or reduced value 60 is fed to the VCO calibration input 94 which slows down or reduces the operating frequency of the VCO 36. Conversely, if the input voltage 40 into the VCO 36 is higher than the reference voltage 66, then the counter 64 counts up which increases the operating frequency of the VCO 36.

Once equilibrium is reached, i.e., where the reference voltage 66 and the input voltage 40 to the VCO 36 are approximately equal, then in one example the dynamic calibration logic 38 counts up one cycle and then counts down one cycle and repeats this oscillation. In one example, this condition can be detected and the dynamic calibration logic 38 can be disabled until a time when the reference voltage 66 and the voltage input 40 to the VCO 36 are no longer approximately the same.

Generally, the frequency range of the VCO 36 can be set by many types of electrical controls. For example, if the VCO frequency is determined by a resistor-capacitor RC delay, the resistance inside the VCO 36 can be controlled by the calibrating signal 60. This can be done by biasing a transistor or by removing or adding resistance using digital bits. In another example, the speed of an LC-type VCO is determined by the values of the inductor/capacitance (LC) network, where the capacitance may be an adjustable or selectable array of capacitors. Subsequently, when calibrating the VCO 36, the digital data 60 from the counter 64 can be used to dial-in more or less capacitance.

In another embodiment, a voltage difference between reference signal 66 and voltage 40 may be used to determine the amount of correction that the VCO 36 requires. For example, if the voltage difference is large indicating that the control voltage 40 is much larger than the reference voltage 66, then instead of moving the VCO calibration up by 1 bit, the VCO calibration may be increased by 4 bits, in one example.

While FIG. 2 illustrates a particular implementation of a phase locked loop 32, it is understood that embodiments of the present invention may be used with other designs or implementations of phase locked loops including conventional phase locked loops.

Referring to FIG. 3, FIG. 3 illustrates an example of logical operations for dynamically adjusting the operating frequency of a phase locked loop, in accordance with one embodiment of the present invention. At operation 100, a phase locked loop is provided. In this operation, a conventional phase locked loop may be provided with a voltage controlled oscillator (VCO) having a control input or port for receiving a signal to control or adjust the calibration of the operating frequency of the VCO.

At operation 102, dynamic calibration logic is provided which dynamically monitors the input voltage to the VCO in order to determine whether the operating frequency of the VCO should be adjusted (i.e., increased or decreased) in order to keep the VCO operating at a desired frequency. In one example, the dynamic calibration logic monitors the input voltage signal to the VCO in real time and dynamically adjusts the calibration of the VCO in response thereto.

At operation 104, the phase locked loop is initiated, and at operation 106, the voltage signal input into the VCO is read. In one example, the dynamic calibration logic receives the voltage signal input into the VCO.

At operation 108, the voltage signal read at operation 106 is compared to a reference signal. In one example, the reference signal is a constant voltage signal that is compared to the voltage signal read at operation 106. The value of the reference signal will depend on the particular implementation, including the characteristics of the VCO, the desired operating frequency of the phase locked loop, for example.

If the comparison operation 108 determines that the voltage signal is greater than the reference signal, then control is passed to operation 110 which increases the operating frequency of the voltage controlled oscillator. In one example, operation 110 includes the dynamic calibration logic providing one or more signals to the VCO to increase or adjust upwardly the calibration of the operating frequency of the VCO. Control is then returned to operation 106.

If, conversely, comparison operation 108 determines that the voltage signal is less than the reference signal, then control is passed to operation 112 which decreases the operating frequency of the VCO. In one example, at operation 112 the dynamic calibration logic generates a digital signal to the calibration input of the voltage controlled oscillator to decrease or downwardly calibrate the operating frequency of the VCO. Control then returns to operation 106. If desired, once the VCO frequency is locked, the digital calibration may be disabled.

It is understood that depending upon the implementation, the voltage reference signal can be selected so that the decision criteria in operations 108-112 may be different than those shown in FIG. 3.

Accordingly, it can be seen that the operations of FIG. 3 permit a phase locked loop, such as a conventional phase locked loop, to provide a precise output high frequency clock signal that operates in spite of varying operating conditions or parameters.

While embodiments of the invention have been described with reference to a VCO 36, other types of oscillators may be used in place of or in addition to a VCO, such as variable frequency oscillators (VFO), current controlled oscillators, or any other type of conventional oscillator.

Embodiments of the present invention may be used in various semiconductors, memories, processors, controllers, integrated circuits, logic or programmable logic, clock circuits, and the like.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

While the invention has been particularly shown and described with reference to embodiments thereof, it will be understood by those skilled in the art that various other changes in the form and details may be made without departing from the spirit and scope of the invention.

What is claimed is:

1. A circuit for providing a periodic clock signal, comprising:
   a phase locked loop circuit having a voltage controlled oscillator, the voltage controlled oscillator having an input voltage, a calibration input, and a clock signal output; and
   a logic circuit for dynamically calibrating an operating frequency of the phase locked loop during operation of the phase locked loop, the logic circuit having a counter output coupled with the input voltage of the voltage controlled oscillator, the logic circuit including,
      a comparator having a first and a second input and a comparator output, the first input coupled with a single reference voltage and the second input coupled with the input voltage input of the voltage controlled oscillator, the comparator comparing the input voltage only against the single reference voltage, and
      an up/down counter having at least one input and the counter output, the at least one input coupled with the comparator output, so that if the input voltage is different than the reference voltage, the counter output adjusts the operating frequency of the phase locked loop circuit, and so that if the input voltage is substantially equal to the reference voltage, the counter output counts up one cycle and counts down one cycle and repeats until the input voltage is no longer substantially equal to the reference voltage.

2. The circuit of claim 1, wherein if the input voltage is lower than the reference voltage, the logic circuit decreases the operating frequency of the phase locked loop circuit.

3. The circuit of claim 1, wherein if the input voltage is higher than the reference voltage, the logic circuit increases the operating frequency of the phase locked loop circuit.

4. The circuit of claim 1, wherein if the input voltage is lower than the reference voltage, the counter output counts downwardly to decrease the operating frequency of the phase locked loop circuit.

5. The circuit of claim 1, wherein if the input voltage is higher than the reference voltage, the counter output counts upwardly to increase the operating frequency of the phase locked loop circuit.

6. The circuit of claim 1, further comprising:
   means for disabling the logic circuit, the means for disabling being coupled with the logic circuit.

7. A method for generating a periodic clock signal, comprising:
   providing a phase locked loop circuit having a voltage controlled oscillator;
   dynamically calibrating an operating frequency of the phase locked loop during operation of the phase locked loop by comparing an input voltage into the voltage controlled oscillator only against a single reference voltage to generate a comparison signal for adjusting the operating frequency and
   disabling the operation of dynamically calibrating when the input voltage is approximately equal to the single reference voltage by detecting a counter output counting up one cycle and counting down one cycle in response to the comparison signal and repeating until the input voltage is no longer substantially equal to the reference voltage.

8. The method of claim 7, further comprising:
   if the input voltage is lower than the reference voltage, decreasing the operating frequency of the phase locked loop circuit.

9. The method of claim 7, further comprising:
   if the input voltage is higher than the reference voltage, increasing the operating frequency of the phase locked loop circuit.

10. A circuit for providing a periodic clock signal, comprising:
    a phase locked loop circuit having a voltage controlled oscillator, the voltage controlled oscillator having an input voltage, a calibration input, and a clock signal output; and
    a logic circuit for dynamically calibrating an operating frequency of the phase locked loop during operation of the phase locked loop, the logic circuit having a counter output coupled with the input voltage of the voltage controlled oscillator, the logic circuit including
       a comparator having a first and a second input and a comparator output, the first input coupled with a single reference voltage and the second input coupled with the input voltage input of the voltage controlled oscillator, the comparator comparing the input voltage only against the single reference voltage,
       an up/down counter having at least one input and the counter output, the at least one input coupled with the comparator output, so that if the input voltage is different than the reference voltage, the counter output adjusts the operating frequency of the phase locked loop circuit, and so that if the input voltage is substantially equal to the reference voltage, the counter output counts up one cycle and counts down one cycle and repeats until the input voltage is no longer substantially equal to the reference voltage, and a NAND gate, a reference signal coupled to a first input of the NAND gate and a disable signal coupled to a second input of the NAND gate, wherein an output of the NAND gate is a digital signal that toggles between low and high with a frequency proportional to the reference signal when the disable signal is high, and wherein the up/down counter is disabled when the disable signal is low.

11. The circuit of claim 10, wherein if the input voltage is lower than the reference voltage, the logic circuit decreases the operating frequency of the phase locked loop circuit.

12. The circuit of claim 10, wherein if the input voltage is higher than the reference voltage, the logic circuit increases the operating frequency of the phase locked loop circuit.

13. The circuit of claim 10, wherein if the input voltage is lower than the reference voltage, the counter output counts downwardly to decrease the operating frequency of the phase locked loop circuit.

14. The circuit of claim 10, wherein if the input voltage is higher than the reference voltage, the counter output counts upwardly to increase the operating frequency of the phase locked loop circuit.

15. The circuit of claim 10, further comprising:
  means for disabling the logic circuit, the means for disabling being coupled with the logic circuit.

* * * * *